United States Patent
Park et al.

(10) Patent No.: US 11,404,520 B2
(45) Date of Patent: Aug. 2, 2022

(54) ORGANIC LIGHT EMITTING DIODE DISPLAY

(71) Applicant: SAMSUNG DISPLAY CO., LTD., Yongin-si (KR)

(72) Inventors: Jun Hyun Park, Suwon-si (KR); Dong Woo Kim, Yongin-si (KR); Sung Jae Moon, Seongnam-si (KR); Kang Moon Jo, Hwaseong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 58 days.

(21) Appl. No.: 16/735,990

(22) Filed: Jan. 7, 2020

(65) Prior Publication Data

US 2020/0219962 A1 Jul. 9, 2020

(30) Foreign Application Priority Data

Jan. 9, 2019 (KR) .................. 10-2019-0002678

(51) Int. Cl.
  *H01L 27/32* (2006.01)
  *G09G 3/3258* (2016.01)
  *G09G 3/3291* (2016.01)

(52) U.S. Cl.
  CPC ....... *H01L 27/3276* (2013.01); *G09G 3/3258* (2013.01); *G09G 3/3291* (2013.01);
  (Continued)

(58) Field of Classification Search
  CPC ............ H01L 27/3276; H01L 27/3279; H01L 27/329; G09G 2300/0861; G09G 2300/0426
  See application file for complete search history.

(56) References Cited

U.S. PATENT DOCUMENTS 9,231,040 B2 * 1/2016 Park ................. H01L 27/3276
9,716,134 B2 * 7/2017 Lin ................... H01L 29/78606
(Continued)

FOREIGN PATENT DOCUMENTS

JP        2017-173505        9/2017
KR     2004000778 A *   1/2004
(Continued)

OTHER PUBLICATIONS

Partial European Search Report dated Sep. 28, 2020 in corresponding European Patent Application Serial No. 20150797.7 (17 pages).

*Primary Examiner* — Tuan A Hoang
(74) *Attorney, Agent, or Firm* — F. Chau & Associates, LLC

(57) ABSTRACT

An organic light emitting diode display according to exemplary embodiments includes: a data wire including a data line disposed in a display area and a first data line disposed in a peripheral area; a driving voltage wire including a driving voltage line disposed in the display area and a first driving voltage line disposed in the peripheral area and extending in a first direction; and a driving low voltage wire including a cathode covering the display area and formed to the peripheral area and a first driving low voltage connection portion connected to the cathode and disposed in the peripheral area, wherein the first driving low voltage connection portion includes a first portion and a second portion having a different width than the first portion.

19 Claims, 10 Drawing Sheets

(52) U.S. Cl.
   CPC . *H01L 27/3279* (2013.01); *G09G 2300/0426* (2013.01); *H01L 27/329* (2013.01); *H01L 27/3248* (2013.01)

(56) References Cited

U.S. PATENT DOCUMENTS

| | | |
|---|---|---|
| 10,043,453 B2 | 8/2018 | An et al. |
| 2015/0116295 A1* | 4/2015 | Pyon .................. G09G 3/3291 345/211 |
| 2016/0079280 A1* | 3/2016 | Kim .................... H01L 27/124 257/773 |
| 2017/0365217 A1* | 12/2017 | An ...................... H01L 27/3279 |

FOREIGN PATENT DOCUMENTS

| | | | |
|---|---|---|---|
| KR | 20040000778 A | * | 1/2004 |
| KR | 10-0590984 | | 6/2006 |
| KR | 10-0835008 | | 5/2008 |
| KR | 10-1249246 | | 3/2013 |
| KR | 10-2016-0082669 | | 7/2016 |
| KR | 10-2018-0031866 | | 3/2018 |

* cited by examiner

ORGANIC LIGHT EMITTING DIODE DISPLAY

CROSS-REFERENCE TO RELATED APPLICATION

This application claims priority to and the benefit of Korean Patent Application No. 10-2019-0002678 filed in the Korean Intellectual Property Office on Jan. 9, 2019, the entire contents of which are incorporated by reference herein.

BACKGROUND

(a) Field

The present disclosure relates to an organic light emitting diode display, and in detail, relates to a voltage line applied to a pixel of the organic light emitting diode display.

(b) Description of the Related Art

A display device is a device displaying an image, and recently, an organic light emitting diode display has received attention.

Since an organic light emitting diode display has a self-emission characteristic and does not require a separate light source, unlike a liquid crystal display device, it is possible to reduce the thickness and weight thereof. Further, an organic light emitting diode display has high-quality characteristics such as low power consumption, high luminance, and a high response speed.

An organic light emitting diode (OLED) display has a complicated pixel structure as compared to a liquid crystal display, and a number of wires are connected to each pixel such that the wiring structure of a peripheral area surrounding the display area is relatively complicated.

The above information disclosed in this Background section is only for enhancement of understanding of the background of the invention and therefore it may contain information that does not form the prior art that is already known in this country to a person of ordinary skill in the art.

SUMMARY

Exemplary embodiments are intended to have the same or a smaller parasitic capacitance that occurs when a plurality of signal lines disposed in a fan-out region overlapping wires applying a driving low voltage ELVDSS or a driving voltage ELVDD than the prior art. Also, exemplary embodiments are intended to minimize a voltage drop of the driving voltage ELVDD and the driving low voltage ELVSS.

An organic light emitting diode display according to exemplary embodiments includes: a data wire including a data line disposed in a display area and a first data line disposed in a peripheral area; a driving voltage wire including a driving voltage line disposed in the display area and a first driving voltage line disposed in the peripheral area and extending in a first direction; and a driving low voltage wire including a cathode covering the display area and formed to the peripheral area and a first driving low voltage connection portion connected to the cathode and disposed in the peripheral area, wherein the first driving low voltage connection portion includes a first portion and a second portion having a different width than the first portion.

The first driving low voltage connection portion may include a wiring portion having the portion with the different width and a pad portion disposed at both sides thereof.

The wiring portion of the first driving low voltage connection portion may have a triangular shape.

The wiring portion of the first driving low voltage connection portion may include a first portion having a first thickness and a second portion having a second thickness.

A first additional metal layer disposed in the peripheral area and overlapping the first driving low voltage connection portion may be further included, and the first additional metal layer may be electrically connected to the first driving low voltage connection portion.

The first additional metal layer may be disposed below the semiconductor layer.

The first driving voltage line may further include a pad portion electrically connected to one side.

The first driving voltage line and the driving voltage line may be formed on the same layer.

A second additional metal layer disposed in the peripheral area and overlapping the first driving voltage line may be further included, and the second additional metal layer may be electrically connected to the first driving voltage line.

The second additional metal layer may be disposed below the semiconductor layer.

The first data line may be formed in the gate conductive layer.

An organic light emitting diode display according to an exemplary embodiment includes: a data wire including a data line disposed in a display area and a first data line disposed in a peripheral area; a driving voltage wire including a driving voltage line disposed in the display area and a first driving voltage line disposed in the peripheral area and including a connection portion extending in a first direction; and a driving low voltage wire including a cathode disposed in the display area and a first driving low voltage connection portion connected to the cathode and disposed in the peripheral area, wherein the first driving voltage line or the first driving low voltage connection portion further includes an additional metal layer, and the additional metal layer is disposed in the peripheral area and has lower resistance than the first driving voltage line or the first driving low voltage connection portion, which is connected to the additional metal layer.

The additional metal layer connected to the first driving low voltage connection portion may be a first additional metal layer, and the first additional metal layer may include a portion with a different width.

The first additional metal layer may have a triangular shape.

The first additional metal layer may include a first portion having a first thickness and a second portion having a second thickness.

The first driving low voltage connection portion may include a pad portion disposed on both sides thereof.

The connection portion of the first driving low voltage connection portion may have a straight shape.

The first driving voltage line may have a pad portion extending in the first direction and electrically connected thereto.

The first driving voltage line and the driving voltage line may be formed on the same layer.

The first data line may be formed in the gate conductive layer.

An organic light emitting diode display according to an exemplary embodiment includes: data wiring including a first data line and a second data line disposed in a peripheral area, wherein the first data line is longer than the second data line; a driving voltage wire including a driving voltage line disposed in the display area and a first driving voltage line disposed in the peripheral area and extending in a first direction; and a driving low voltage wire including a cathode covering the display area and formed to the peripheral area and a first driving low voltage connection portion connected to the cathode and disposed in the peripheral area, wherein a first portion of the first driving low voltage connection portion overlapping the first data line is smaller than a second portion of the first driving low voltage connection portion overlapping the second data line.

In some examples, of the organic light emitting diode display described above, a parasitic capacitance of the first data line is made substantially equal to a parasitic capacitance of the second data line by the first portion of the first driving low voltage connection portion being smaller than the second portion of the first driving low voltage connection portion.

According to the exemplary embodiments, a plurality of signal lines disposed in the fan-out region have the same or a smaller parasitic capacitance generated while being overlapped with the wiring to which the driving low voltage (ELVSS) or the driving voltage (ELVDD) is applied than the prior art. In addition, when the driving voltage ELVDD and the driving low voltage ELVSS are applied, a relatively low voltage drop may occur.

DETAILED DESCRIPTION OF THE EMBODIMENTS

Figure 1:
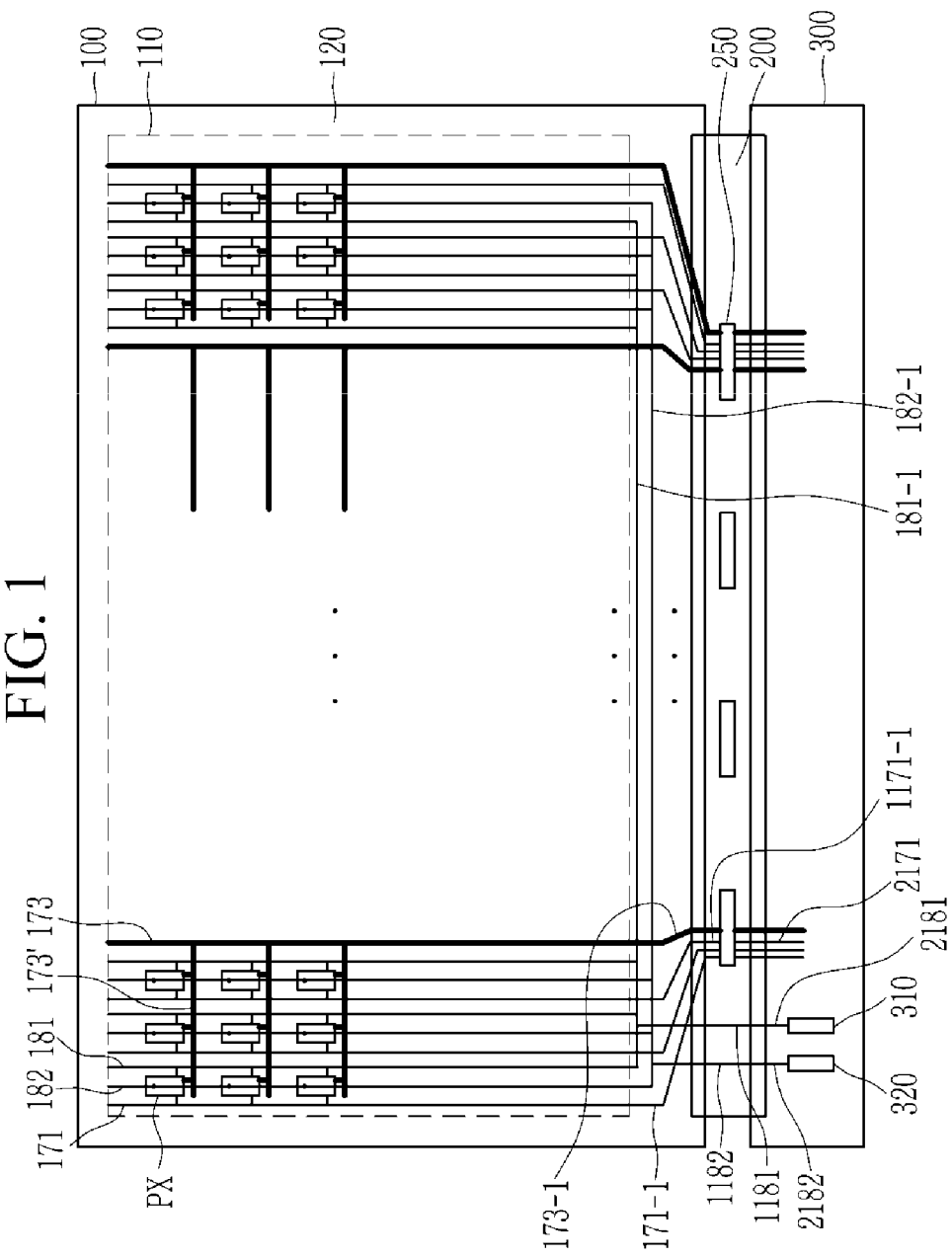
FIG. 1 is a layout view of an organic light emitting diode display according to an exemplary embodiment.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

Descriptions of parts not related to the present invention are omitted, and like reference numerals designate like elements throughout the specification.

Further, since sizes and thicknesses of constituent members shown in the accompanying drawings are arbitrarily given for better understanding and ease of description, the present invention is not limited to the illustrated sizes and thicknesses. In the drawings, the thickness of layers, films, panels, regions, etc., are exaggerated for clarity. In the drawings, for better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, in the specification, the phrase "on a plane" means viewing the object portion from the top, and the phrase "on a cross-section" means viewing a cross-section of which the object portion is vertically cut from the side.

Now, a structure of an organic light emitting diode display is described with reference to FIG. 1.

FIG. 1 is a layout view of an organic light emitting diode display according to an exemplary embodiment.

The organic light emitting diode display according to the present exemplary embodiment includes a display panel 100 in which a pixel PX is formed, a printed circuit board (PCB) 300 in which voltage application units 310 and 320 are formed, and a flexible printed circuit substrate 200 that connects the display panel 100, the printed circuit board (PCB) 300, and a driving chip 250 is formed.

The display panel 100 includes a display area 110 in which the pixel PX is formed to display an image, and a peripheral area 120 surrounding the display area 110 and including a fan-out region.

A data line 171 to which a data voltage is applied, a driving voltage line 181 to which a driving voltage ELVDD is applied, and a driving low voltage line 182 to which the driving low voltage ELVSS is applied are connected to the pixel PX formed in the display area 110. Here, the driving low voltage line 182 may be a cathode 410 having an integral structure entirely covering the display area 110. Further, the pixel PX is applied with an initialization voltage, and is also connected to detection signal lines 173 and detection signal line extension portions 173' sensing a voltage of a specific node in the pixel PX when the initialization voltage is not applied.

The signal lines connected to the pixel PX may include various other lines, and they are omitted in FIG. 1. The pixel PX according to an exemplary embodiment is shown in detail in FIG. 8 to FIG. 10.

In FIG. 1, with respect to the pixel PX, the data line 171 is disposed on the left side, the driving voltage line 181 is disposed on the right side, and the driving low voltage line 182 passes above the pixel PX, however, the present invention is not limited thereto. On the other hand, the detection signal lines 173 and 173' are not formed for each column of the pixel PX, and one longitudinal detection signal line 173 is formed for each column of a plurality of pixels PX and connected to a plurality of pixels PX through a detection signal line extension portion 173' extending in a horizontal direction. In the present exemplary embodiment, one longitudinal detection signal line 173 is formed for every three pixel PX columns, and three pixels PX and the longitudinal detection signal line 173 are connected by the detection signal line extension portion 173'. In addition, according to the exemplary embodiment, the driving voltage line 181 may not be formed for every pixel column.

In the peripheral area 120 of the display panel 100, a peripheral data line 171-1 (hereinafter referred to as a first data line) connected to the data line 171, a peripheral detection signal line 173-1 connected to the longitudinal detection signal line 173, a peripheral driving voltage line 181-1 (hereinafter referred to as a first driving voltage line) connected to the driving voltage line 181, and a peripheral driving low voltage connection portion 182-1 (hereinafter referred to as a first driving low voltage connection portion) connected to the driving low voltage line 182 are formed.

The peripheral data line 171-1 and the peripheral detection signal line 173-1 constitute a structure in which they are gathered from both sides in the fan-out region of the peripheral area 120. This structure is to allow signals from a single driving chip 250 to be applied in a predetermined region, and the peripheral data line 171-1 and the peripheral detection signal line 173-1 have the structure in which they are gathered toward the center of the fan-out region while being bent. Accordingly, pads disposed at the ends of the peripheral data line 171-1 and the peripheral detection signal line 173-1 may be disposed to be gathered near the driving chip 250. Also, the peripheral data lines 171-1 and the peripheral detection signal line 173-1 are formed with different lengths due to the bent structure. As a result, the peripheral data lines 171-1 may have different resistances. In order to eliminate the differences in resistance value, the peripheral data line 171-1 may further include a portion (not shown) for forming an additional resistor so as to have a predetermined resistance. Each peripheral detection signal line 173-1 may further include a portion (not shown) that forms an additional resistance, as with the peripheral data line 171-1. A conductive layer (in the present exemplary embodiment, a data conductive layer) in which the data line 171 and the detection signal line 173 are formed in the display area 110, and a conductive layer (in the present exemplary embodiment, a gate conductive layer) in which the peripheral data line 171-1 and the peripheral detection signal line 173-1 are formed in the peripheral area 120, may be different conductive layers.

The peripheral driving voltage line 181-1 is extended in the horizontal direction and has a structure including a connection line for connecting a plurality of driving voltage lines 181. The connection line of the peripheral driving voltage line 181-1 may be integrally formed on the entire peripheral area 120, thereby having a structure connecting all driving voltage lines 181 with one connection line. However, according to a typical embodiment, a plurality of connection lines of the peripheral driving voltage line 181-1 may be formed so that one connection line may be connected to only some of the driving voltage lines 181.

Figure 2:
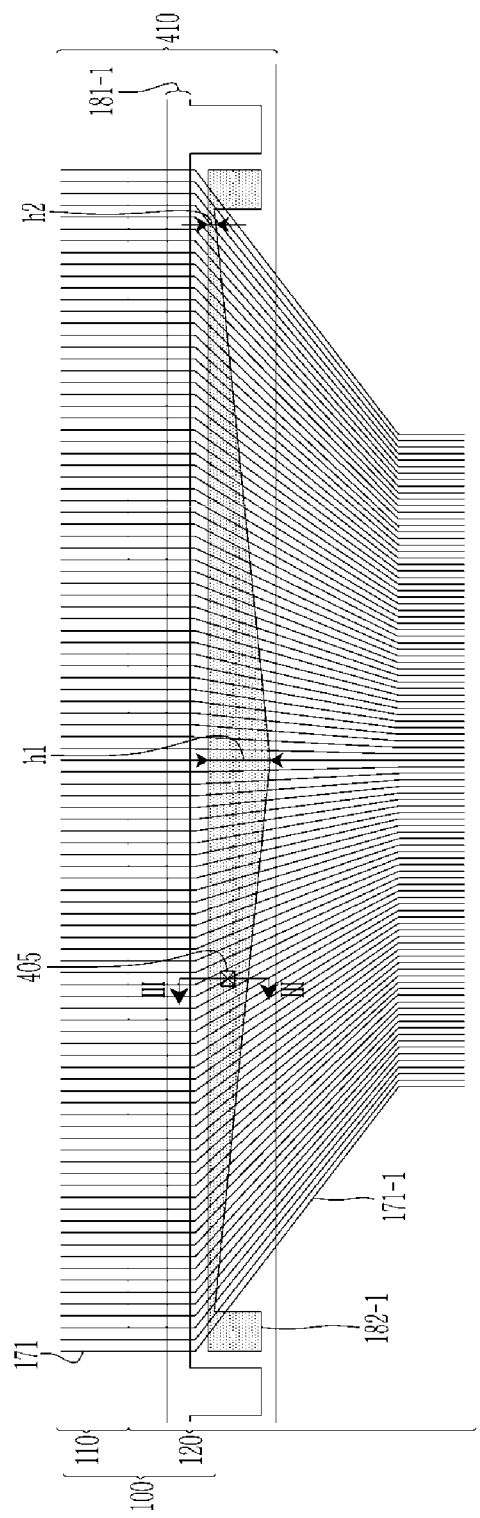
FIG. 2 is an enlarged view of a peripheral area of an organic light emitting diode display according to an exemplary embodiment.

On the other hand, a plurality of peripheral driving low voltage connection portions 182-1 are formed and separated from each other. While FIG. 1 shows the wiring structure extending in one horizontal direction, FIG. 2 shows that each separated connection portion may be connected by the cathode 410 to be connected in a circuit structure. That is, each separated peripheral driving low voltage connection portion 182-1 is connected to the driving low voltage line 182 of the cathode 410 covering the display area 110. The cathode 410 not only entirely covers the display area 110, but is also partially formed in the peripheral area 120 and is connected to the peripheral driving low voltage connection part 182-1 at the peripheral area 120. The driving low voltage ELVSS applied to the peripheral driving low voltage connection portion 182-1 is transmitted to the cathode 410, and the portion applying the driving low voltage ELVSS to the cathode 410 may have a plurality of positions.

The peripheral data line 171-1 formed in the peripheral area 120 may be formed in a different conductive layer from the peripheral driving voltage line 181-1 and the peripheral driving low voltage connection portion 182-1, thereby having an overlapped structure in a layout view. In contrast, the peripheral driving voltage line 181-1 and the peripheral driving low voltage connection portion 182-1 may be formed on the same conductive layer, thereby having the separated structure in a layout view. The peripheral driving voltage line 181-1 and the peripheral driving low voltage connection portion 182-1 are formed in the same conductive layer (the data conductive layer in the present embodiment) as the driving voltage line 181.

The data line 171 disposed in the display area 110 and the peripheral data line 171-1 disposed in the peripheral area 120 are also referred to as the data wire hereinafter.

The driving voltage line 181 disposed in the display area 110 and the peripheral driving voltage line 181-1 disposed in the peripheral area 120 are also referred to as a driving voltage wire hereinafter.

The cathode 410 covering the display area 110 and formed to the peripheral area 120 and the peripheral driving low voltage connection part 182-1 disposed in the peripheral area 120 are also referred to as a driving low voltage wire hereinafter. Here, the driving low voltage wiring may include the driving low voltage line 182.

The flexible printed circuit substrate 200 includes the driving chip 250 applying the data voltage to the data line 171, and an input wire 2171 transmitting the signal to the driving chip 250 and an output wire 1171-1 outputting the data voltage from the driving chip 250.

The output wire 1171-1 is connected to the peripheral data line 171-1 disposed in the peripheral area 120. The input wiring 2171 has a structure receiving the signal from the printed circuit board (PCB) 300 side.

On the other hand, in the flexible printed circuit substrate 200, a driving voltage transmitting line 1181 applying the driving voltage ELVDD and a driving low voltage transmitting line 1182 applying the driving low voltage ELVSS are further included.

The driving voltage transmitting line 1181 is connected to the peripheral driving voltage line 181-1 of the peripheral area 120, and the driving low voltage transmitting line 1182 is connected to the peripheral driving low voltage connection portion 182-1 of the peripheral area 120.

The printed circuit board (PCB) 300 includes a driving voltage application unit 310 generating and transmitting the driving voltage ELVDD, and a driving low voltage application unit 320 generating and transmitting the driving low voltage ELVSS. The printed circuit board (PCB) 300 includes a driving voltage output line 2181 connected to the driving voltage application unit 310. The driving voltage output line 2181 is connected to the driving voltage transmitting line 1181 of the flexible printed circuit substrate 200. As a result, the driving voltage ELVDD is transmitted to the display panel 100. The printed circuit board (PCB) 300 further includes a driving low voltage output line 2182 connected to the driving low voltage application unit 320. The driving low voltage output line 2182 is connected to a driving low voltage transmitting line 1182 of the flexible printed circuit substrate 200. As a result, the driving low voltage ELVSS is transmitted to the display panel 100.

The printed circuit board (PCB) 300 may further include an image driver for dividing and transferring an image signal applied from the outside to each driving chip 250 disposed on the flexible printed circuit substrate 200. The image driver is connected to the input wire 2171 of the flexible printed circuit substrate 200 through the image signal transmitting line. As a result, the image signal is transmitted to the driving chip 250.

Figure 3:
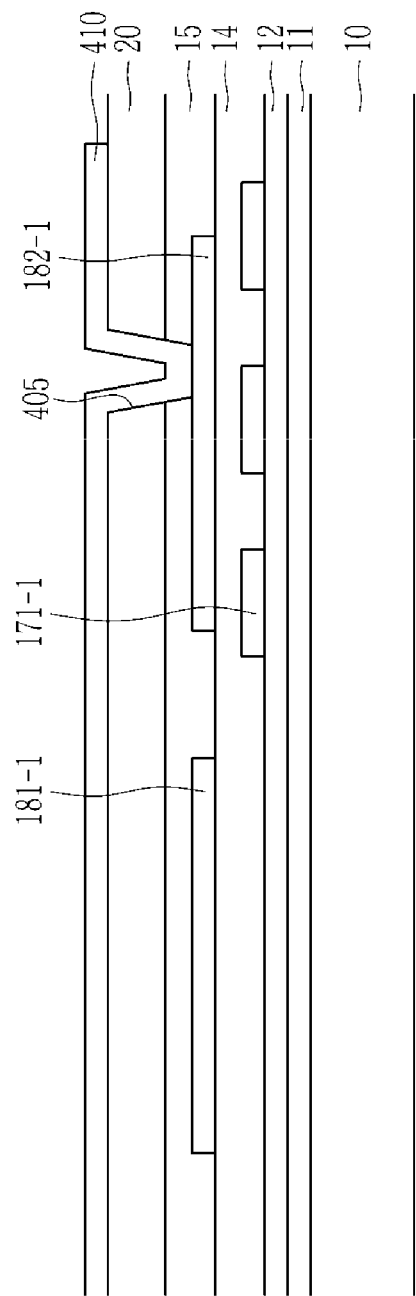
FIG. 3 is a cross-sectional view taken along a line III-III of FIG. 2.

In the above-described organic light emitting diode display, the structure of the peripheral area 120 is described in detail through FIG. 2 and FIG. 3.

FIG. 2 is an enlarged view of a peripheral area of an organic light emitting diode display according to an exemplary embodiment, and FIG. 3 is a cross-sectional view taken along a line III-III of FIG. 2.

FIG. 2 shows the peripheral area 120 disposed at the lower portion of the display panel 100, and one fan-out region where the peripheral data lines 171-1 are gathered is focused on.

First, each data line 171 has a structure that extends in the vertical direction in the display area 110, is connected to a peripheral data line 171-1 in the peripheral area 120, and is bent in the fan-out area to be gathered to the center of the fan-out area.

Different peripheral data lines 171-1 are bent differently. For example, a peripheral data line 171-1 near the center of the fan-out area may have a less substantial bend (or no bend at all) whereas a peripheral data line 171-1 near the edge of the fan-out area may have a more substantial bend (i.e., bent at a greater angle, continuing in the altered direction for a greater length, or both). This causes different peripheral data lines 171-1 to have different overall lengths, and as a result, different electrical properties such as resistance or parasitic capacitance.

Therefore, a compensating portion may be configured to reduce the differences in the electrical properties of the different peripheral data lines 171-1 (e.g., a structure including the peripheral driving low voltage connection portion 182-1 described below). The compensating portion may achieve this equalizing effect by overlapping different peripheral data lines 171-1 by different amounts. That is, when two conductors at different potentials are close to one another, they are affected by each other's electric field and store opposite electric charges like a capacitor. Thus, the proximity of the peripheral data lines 171-1 to the compensating portion (i.e., the structure including the peripheral driving low voltage connection portion 182-1) may result in parasitic capacitance that increases with the length of the overlap between the two elements. Thus, making the length of the overlap different for different peripheral data lines 171-1 can reduce or eliminate differences in parasitic capacitance caused by the fan-out structure (i.e., the differential bending of the peripheral data lines 171-1). As a result, the signals passing through the different peripheral data lines 171-1 can be more effectively synchronized, which may result in improved performance of the display.

Referring to FIG. 3, the peripheral data line 171-1 is formed in a layer (a gate conductive layer) in which a gate line is formed rather than a layer (the data conductive layer) in which a data line 171 is formed. As a result, each data line 171 has a structure that passes through the display area 110, is formed in the data conductive layer to the partial region of the peripheral area 120, and is electrically connected to a peripheral data line 171-1 formed in the gate conductive layer through a contact structure. Here, the gate conductive layer is formed closer to the semiconductor layer than the data conductive layer, and has a position disposed far away from the anode and cathode layers.

The peripheral driving voltage line 181-1 and the peripheral driving low voltage connection portion 182-1 are formed in the data conductive layer of the peripheral area 120. Since the peripheral driving voltage line 181-1 and the peripheral driving low voltage connection portion 182-1 are formed on the same layer, they are separated from each other in a plan view.

In other words, the gate conductive layer is the layer where the peripheral data line 171-1 is formed, and the data conductive layer is the layer where the peripheral driving voltage line 181-1 and the peripheral driving low voltage connection portion 182-1 are formed.

The peripheral driving voltage line 181-1 disposed in the peripheral area 120 extends in the horizontal direction (the first direction), and includes a pad portion that is protruded in a downward direction to be electrically connected. The pad portion of the peripheral driving voltage line 181-1 is disposed between the adjacent fan-out regions. The pad portion of the peripheral driving voltage line 181-1 is connected to the driving voltage transmitting line 1181 of the flexible printed circuit substrate 200 to receive the driving voltage ELVDD. The driving voltage ELVDD transmitted to the peripheral driving voltage line 181-1 is then transmitted to the driving voltage line 181. As the number of the pad portions protruded from the peripheral driving voltage line 181-1 increases, the driving voltage ELVDD has the characteristic that it is constant in the display area 110. Since the driving voltage line 181 is formed on the data conductive layer and the peripheral driving voltage line 181-1 is formed on the data conductive layer, the driving voltage line 181 and the peripheral driving voltage line 181-1 may have an integral structure in which they are directly connected without a separate contact structure.

The peripheral driving low voltage connection portion 182-1 disposed in the peripheral area 120 has a plurality of separated structures. In one connection portion, pad portions are disposed on both sides and a wiring portion connecting two pad portions is formed. That is, the peripheral driving voltage line 181-1 has a structure that is connected by the connection line as a whole, but the peripheral driving low voltage connection portion 182-1 has a plurality of separated connection portions.

In addition, the wiring portion of the peripheral driving low voltage connection portion 182-1 has a structure in which the width increases toward the center of the fan-out region. This structure causes the parasitic capacitance generated in the peripheral data lines 171-1 and the peripheral detection signal lines 173-1 due to the peripheral driving low voltage connection portion 182-1 to be constant or nearly constant for all peripheral data lines 171-1 and peripheral detection signal lines 173-1. This structure (an equal capacitance structure) reduces or eliminates the difference in the signal delay caused by the fact that the data line 171 may have a differential parasitic capacitance in the fan-out region due to the peripheral data line 171-1. Also, the difference of the signal delay caused by a detection signal line 173 that may have a differential parasitic capacitance in the fan-out region due to the peripheral detection signal line 173-1 may be reduced or removed.

On the edge of the fan-out region, the wiring portion of the peripheral driving low voltage connection portion 182-1 has a narrow width h2 so as to only be slightly overlapped with the wiring (i.e., of the peripheral data lines 171-1 and the peripheral detection signal lines 173-1). At the center of the fan-out region, the wiring portion of the peripheral driving low voltage connection portion 182-1 has a wide width h1 so as to be largely overlapped. As a result, all peripheral data lines 171-1 and peripheral detection signal lines 173-1 have the same or almost the same parasitic capacitance.

If the equal capacitance structure according to an exemplary embodiment of the present invention is used together with a structure of the peripheral data lines 171-1 having equal resistance, it is possible to keep RC delay values generated in the peripheral data line 171-1 constant or nearly constant. As a result, the RC delay values generated in all data lines 171 becomes the same, so that no problem arises due to the delay difference generated for each wiring.

Also, in all peripheral detection signal lines 173-1, the parasitic capacitance generated by overlapping the wiring portion of the peripheral driving low voltage connection portion 182-1 is the same or almost the same. Also, the peripheral detection signal line 173-1 may include a structure having equal resistance such as that of the peripheral data line 171-1.

Each peripheral driving low voltage connection portion 182-1 forms a contact structure that is in contact with the driving low voltage line 182 in the peripheral area 120. That is, the driving low voltage line 182 is formed as a cathode 410 covering the region of the display area 110, and the cathode 410 is extended to the peripheral area 120. In addition, since the peripheral driving low voltage connection portion 182-1 in the fan-out region is formed of the data conductive layer, it may be electrically connected to the cathode 410 located thereon through an opening 405.

In some embodiments, the cathode 410 not only covers the region of the display area 110 but is also formed in the peripheral area 120, and according to the embodiment shown in FIG. 2, it covers the peripheral driving low voltage connection portion 182-1 and the peripheral driving voltage line 181-1. However, according to an exemplary embodiment, the cathode 410 may have a structure overlapping only a part of the peripheral driving low voltage connection portion 182-1 or the peripheral driving voltage line 181-1.

FIG. 3 shows the position relationship of certain wires through a cross-sectional view.

According to FIG. 3, a buffer layer 11 is stacked on a substrate 10. The substrate 10 may be a glass substrate or a flexible substrate such as plastic. A metal layer may be formed on the substrate 10, but in the cross-sectional view of FIG. 3, there is no metal layer shown. Also, a semiconductor layer is formed on the buffer layer 11, although the semiconductor layer may not be formed in the peripheral area 120. A gate insulating layer 12 is stacked on the buffer layer 11. The gate conductive layer is formed on the gate insulating layer 12 and the peripheral data line 171-1 is formed in the peripheral area 120. An interlayer insulating layer 14 covering the peripheral data line 171-1 and the gate insulating layer 12 is stacked thereon. According to an exemplary embodiment, the layer used to construct the pixel PX may include a second gate conductive layer. In this case, the second gate insulating layer (not shown) may be further formed between the interlayer insulating layer 14 and the gate insulating layer 12. Also, according to an exemplary embodiment, the peripheral data line 171-1 may be formed of the second gate conductive layer.

The data conductive layer is formed on the interlayer insulating layer 14, and the peripheral driving voltage line 181-1 and the peripheral driving low voltage connection portion 182-1 are formed in the peripheral area 120. The peripheral driving voltage line 181-1 may have the directly connected structure since the driving voltage line 181 of the display area 110 is formed in the data conductive layer.

An organic insulator 15 covering the peripheral driving voltage line 181-1 and the peripheral driving low voltage connection portion 182-1 is formed thereon. An anode layer may be formed on the organic insulator 15. A partition 20 covering the organic insulator 15 is formed thereon. The cathode 410 is formed on the partition 20, and the cathode 410 and the peripheral driving low voltage connection portion 182-1 are electrically connected through the opening 405 formed in the organic insulator 15 and the partition 20.

In the above, an exemplary embodiment having the equal capacitance structure formed of a structure in which the width of the peripheral driving low voltage connection portion 182-1 gradually changes was described. This structure is also referred to as a triangular structure or a triangular shape hereinafter. Referring to FIG. 2, the structure of the wiring portion of the peripheral driving low voltage connection portion 182-1 has a triangular shape since the portion connected to the pad portion has a narrow width h2, and for convenience, in this specification, it is sometimes referred to as the triangle.

Hereinafter, in addition to the equal capacitance structure, a structure of the peripheral driving voltage line 181-1 and the peripheral driving low voltage connection portion 182-1 formed to have low resistance through the wiring additionally formed in the peripheral area 120 is described.

Figure 4:
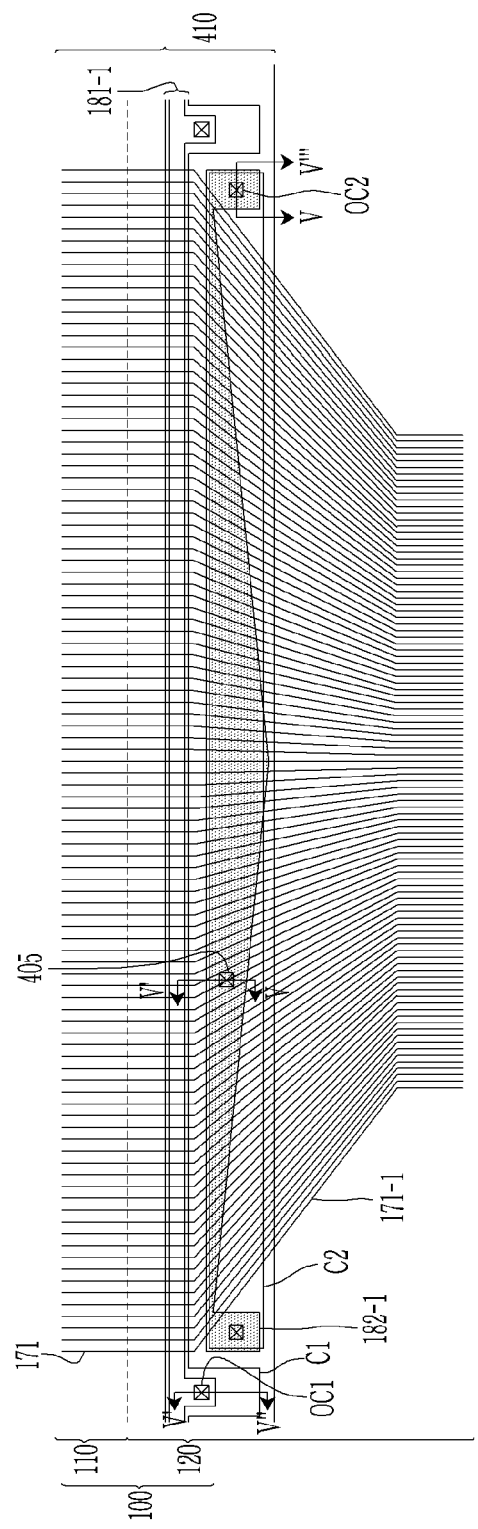
FIG. 4 is an enlarged view of a peripheral area of an organic light emitting diode display according to an exemplary embodiment.
Figure 5:
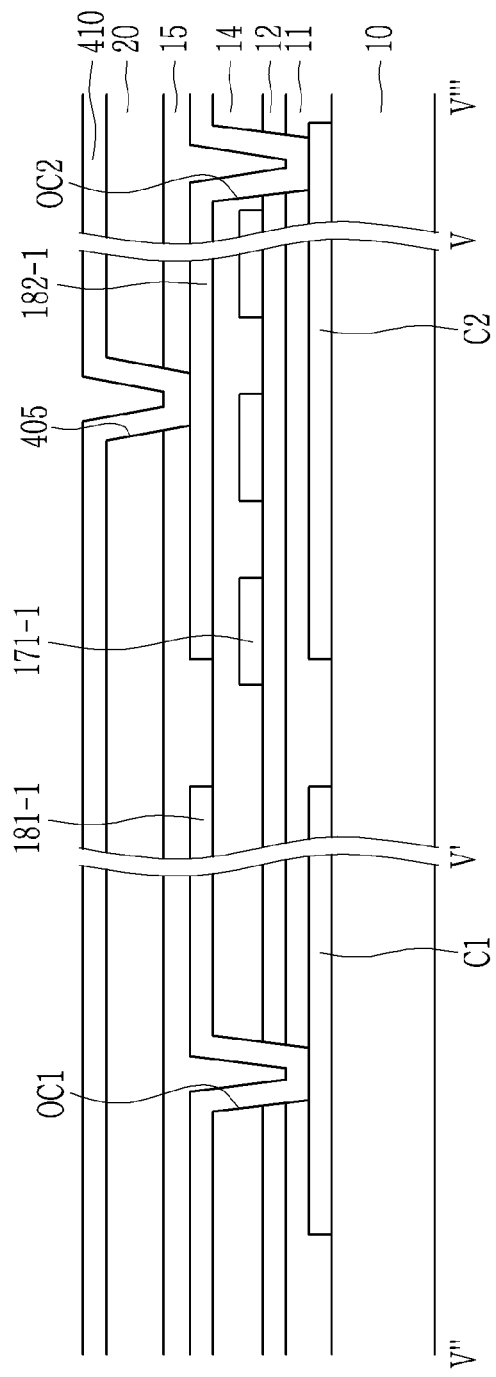
FIG. 5 is a cross-sectional view taken along a line V-V of FIG. 4.

FIG. 4 is an enlarged view of a peripheral area of an organic light emitting diode display according to an exemplary embodiment, and FIG. 5 is a cross-sectional view taken along a line V-V of FIG. 4.

Referring to FIGS. 4 and 5, compared with FIG. 3, additional metal layers C1 and C2 may be formed between the substrate 10 and the buffer layer 11. Each of the additional metal layers C1 and C2 has a structure that overlaps the peripheral driving voltage line 181-1 and the peripheral driving low voltage connection portion 182-1, respectively, and is electrically connected thereto.

FIG. 4 shows an opening OC1 is shown which may refer to an opening in, for example, the buffer layer 11, the gate insulating layer 12, and the interlayer insulating layer 14 such that wires in the data conductive layer may be connected with the additional metal layer C1.

Specifically, the peripheral driving voltage line 181-1 is formed in the data conductive layer and is connected to the additional metal layer C1 formed in the metal layer below the buffer layer 11 to reduce the overall resistance. That is, the peripheral driving voltage line 181-1 disposed in the data conductive layer and the additional metal layer C1 are electrically connected through the opening OC1, and the additional metal layer C1 may be formed with lower resistance than the data conductive layer, thereby the entire resistance is reduced.

FIG. 4 may also be distinguished from FIG. 2 in that FIG. 4 shows an embodiment in which an opening OC2 through which the peripheral driving low voltage connection portion 182-1 may be connected to the additional metal layer C2. In the example, shown, the opening OC2 is located at the edge of the fan-out structure. That is, the peripheral driving low voltage connection portion 182-1 is connected to the additional metal layer C2 formed in the metal layer below the buffer layer 11 to reduce the overall resistance. That is, the peripheral driving low voltage connection portion 182-1 disposed in the data conductive layer and the additional metal layer C2 are electrically connected through the opening OC2, and the additional metal layer C2 may be formed with lower resistance than the data conductive layer, thereby the entire resistance is reduced. In the embodiment illustrated by FIG. 4, the additional metal layer C2 has a quadrilateral structure, unlike the structure of the peripheral driving low voltage connection portion 182-1 (which has a triangular structure). However, according to an exemplary embodiment, the additional metal layer C2 may also have a structure (i.e., the triangular shape) in which the width gradually changes like the structure of the peripheral driving low voltage connection portion 182-1. This is described with reference to FIG. 6.

Figure 6:
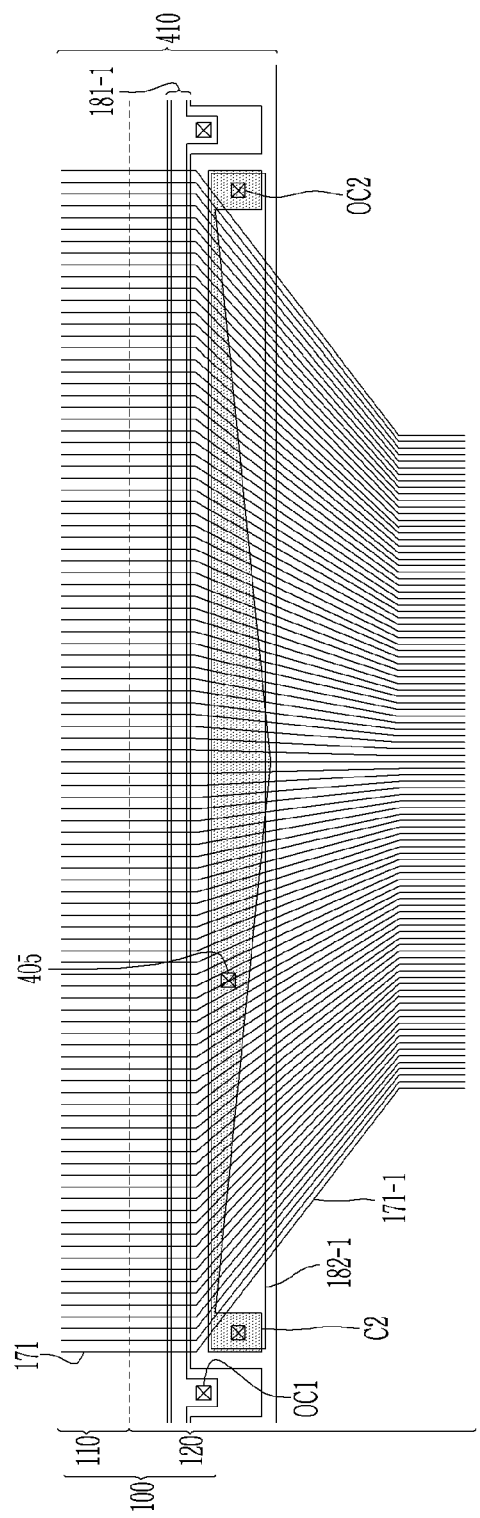
FIG. 6 and FIG. 7 are enlarged views of a peripheral area of an organic light emitting diode display according to an exemplary embodiment.

FIG. 6 is an enlarged view of a peripheral area of an organic light emitting diode display according to an exemplary embodiment.

In FIG. 6, the peripheral driving low voltage connection portion 182-1 has a quadrilateral structure, and the additional metal layer C2 has a triangular structure.

In other words, while FIG. 4 shows an embodiment in which the peripheral driving low voltage connection portion 182-1 has a triangular structure, and the additional metal layer C2 has a rectangular (or quadrilateral) structure, in FIG. 6 the structures are reversed so that the peripheral driving low voltage connection portion 182-1 has a quadrilateral structure, and the additional metal layer C2 has a triangular structure.

However, the aspect that the peripheral driving low voltage connection portion 182-1 is formed in the data conductive layer and the additional metal layer C2 is formed in the metal layer disposed on the substrate 10 is the same in both figures.

In the structure of FIG. 4 and the structure of FIG. 6, the capacitance structure is described as follows.

Wires for applying the low voltage ELVSS (e.g., the peripheral driving low voltage connection portion 182-1 and the additional metal layer C2) are formed above and below the peripheral data line 171-1 and the peripheral detection signal line 173-1, in which the peripheral driving low voltage connection portion 182-1 and the additional metal layer C2 are disposed. The parasitic capacitance is generated based on the overlapping area, because the peripheral driving low voltage connection portion 182-1 or the additional metal layer C2 has a triangular structure, so there is a difference in the area overlapping each of the peripheral data lines 171-1 or the peripheral detection signal lines 173-1. When the length of the peripheral data line 171-1 or the peripheral detection signal line 173-1 is long, the overlapping area is small, and when the length is short, the overlapping area is large, so that the entire parasitic capacitance is formed to be uniform in the peripheral data line 171-1 or the peripheral detection signal line 173-1.

According to an exemplary embodiment, the peripheral driving low voltage connection portion 182-1 and the additional metal layer C2 may both have a structure (e.g., a triangular shape) in which the width is gradually changed. In this case, the width difference between the overlapping low voltage layers may be small compared with the exemplary embodiment of FIG. 4 and FIG. 6.

According to an exemplary embodiment, the parasitic capacitance generated in the peripheral data line 171-1 and the peripheral detection signal line 173-1 may not be completely constant, and the difference may be generated in a range where no problems arise due to the difference of the parasitic capacitance.

An example structure in which the parasitic capacitance generated in the peripheral data line 171-1 and the peripheral detection signal line 173-1 is not constant is described with reference to FIG. 7.

Figure 7:
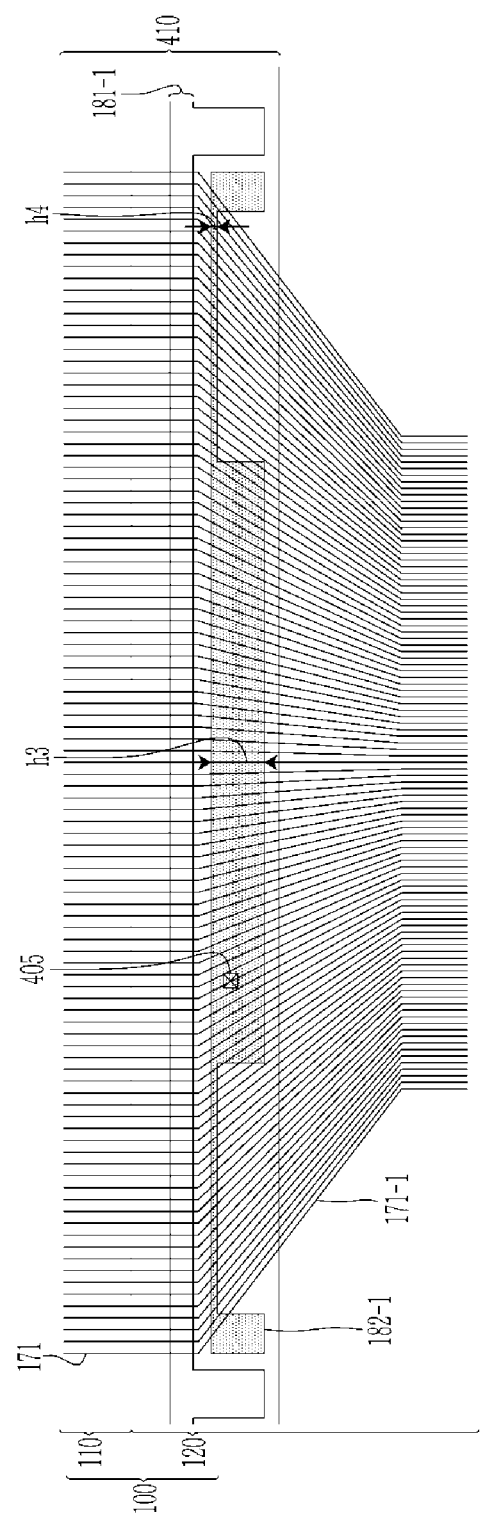

FIG. 7 is an enlarged view of a peripheral area of an organic light emitting diode display according to an exemplary embodiment. Aside from the shaped of the peripheral driving low voltage connection portion 182-1, the embodiment shown in FIG. 7 is similar to that of FIG. 2. For example, the embodiment shown in FIG. 7 does not include additional metal layers C1 or C2 as illustrated in FIGS. 4 and 6. However, this is not limiting of the present inventive concept.

In FIG. 7, the peripheral driving low voltage connection portion 182-1 does not have a triangular structure, but is formed of a structure having different portions with two widths (i.e., h3 and h4) that are different from each other. The portion with a thick width h3 is disposed on the center portion of the fan-out region and the portion with a thin width h4 is disposed on both sides thereof. As a result, the embodiment shown in FIG. 7 is similar to previous exemplary embodiments in that the overlapping area (i.e., between the peripheral driving low voltage connection portion 182-1 and the peripheral data line 171-1) is small when the length of the peripheral data line 171-1 is long and the overlapping area is large when the length is short, however there is a difference in that the width of the peripheral driving low voltage connection portion 182-1 is not gradually increased. Still, according to the exemplary embodiment of FIG. 7, the difference of the parasitic capacitances due to the peripheral data line 171-1 and the peripheral detection signal line 173-1 may be reduced. According to other exemplary embodiments, the width of the peripheral driving low voltage connection portion 182-1 may be formed to have three or more different widths rather than being formed with two widths as shown in in FIG. 7. In example embodiments, the thickest width may be disposed at the center portion of the fan-out region, and the thinner portion is disposed toward both sides.

In some embodiments, the exemplary embodiment of FIG. 7 does not include the additional metal layers C1 and C2, however it may have the additional metal layers C1 and C2 like in FIG. 4. Also, the additional metal layer C2 as shown in FIG. 6 may have the equal capacitance structure of FIG. 7. Similarly, the peripheral driving low voltage connection portion 182-1 may have a structure with constant width.

In the above exemplary embodiments, structures in which the display panel 100 is connected to the flexible printed circuit substrate 200 through the lower portion was mainly described. Additionally or alternatively, the fan-out region may be formed at the upper portion of the display panel 100.

The peripheral driving voltage line 181-1 and the peripheral driving low voltage connection portion 182-1 may be formed in the portion of the peripheral area 120 where the fan-out region is not formed. The peripheral driving low voltage connection portion 182-1 may have an equal capacitance structure in the corresponding portion.

Hereinafter, the structure of a pixel described in exemplary embodiments is described through a circuit diagram of FIG. 8.

Figure 8:
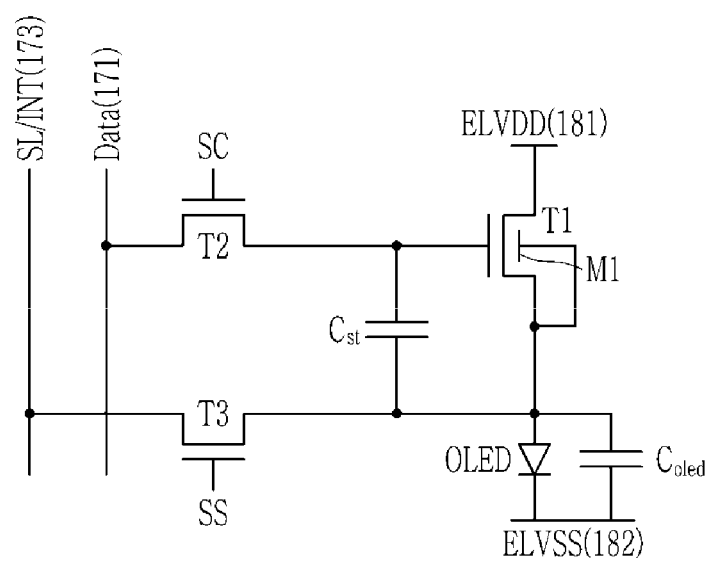
FIG. 8 is a circuit diagram of a pixel of an organic light emitting diode display according to an exemplary embodiment.

FIG. 8 is a circuit diagram of a pixel of an organic light emitting diode display according to an exemplary embodiment.

The pixel PX according to the present exemplary embodiment includes three transistors T1, T2, and T3, an organic light emitting diode OLED, and two capacitors Cst and Coled. Also, the signal line includes a gate line SC, a previous gate line SS, a data line Data, a driving voltage line, a detection signal line SL/INT, and a driving low voltage line. The detection signal line SL/INT also acts as an initialization voltage line for applying the initialization voltage.

The pixel PX according to an exemplary embodiment of FIG. 8 includes a driving transistor T1, a switching transistor connected to the gate line SC, that is, a second transistor T2, and an initialization transistor connected to the previous gate line SS, that is, a third transistor T3 (hereinafter referred to as a sensing transistor). The third transistor may be connected to the signal line that applies a gate-on voltage at different timing from the previous gate line SS.

The gate line SC is connected to the gate driver (not shown) to transmit the scan signal to the second transistor T2 and extends in the horizontal direction.

The previous gate line SS is connected to the gate driver to transmit the previous scan signal applied to the pixel PX disposed at the previous stage to the third transistor T3. The previous gate line SS is extended in the horizontal direction like the gate line SC.

The data line Data and 171 is extended in the vertical direction, and is a wire that receives the data voltage from the driving chip 250 and transfers it to the pixel PX.

The detection signal line SL/INT also extends in the vertical direction, and one detection signal line SL/INT may be formed for each of a plurality of pixel PX lines.

The driving voltage line 181 applies the driving voltage ELVDD, and the driving low voltage line 182 applies the driving low voltage ELVSS. The driving voltage line 181 is extended in the vertical direction. According to an exemplary embodiment, the driving voltage line 181 may be formed of a mesh structure by further including the portion extending in the horizontal direction.

The driving low voltage line 182 may be formed as the cathode 410 covering the entire pixel PX of the display area 110. However, when the cathode 410 is formed of a single plate structure, a difference in voltage value may occur depending on the position. To prevent this, the driving low voltage line 182 may further include the mesh structure including the portion extending in the additional horizontal direction and the portion extending in the vertical direction.

Hereinafter, a plurality of transistors are described.

First, the driving transistor T1 is a transistor that adjusts the magnitude of the current output according to the data voltage applied to the gate electrode and the output driving current is applied to the organic light emitting diode OLED so that the brightness of the organic light emitting diode OLED is controlled. For this purpose, the first electrode (the input side electrode) of the driving transistor T1 is disposed to receive the driving voltage ELVDD and the second electrode (the output side electrode) is connected to the anode of the organic light emitting diode OLED. In addition, the gate electrode of the driving transistor T1 is connected to the second electrode of the second transistor T2 (the output side electrode) so as to receive the data voltage.

On the other hand, the gate electrode of the driving transistor T1 is connected to one electrode of the storage capacitor Cst. The storage capacitor Cst ensures that the data voltage transmitted to the gate electrode of the driving transistor T1 is maintained for one frame. Therefore, the voltage of the gate electrode of the driving transistor T1 is changed depending on the voltage stored in the storage capacitor Cst, and the driving current output from the driving transistor T1 is changed and is output constantly during one frame.

On the other hand, according to an exemplary embodiment, the driving transistor T1 may additionally form the metal layer M1 under the semiconductor layer in which the channel is disposed. The metal layer M1 overlaps the channel and gate electrode of the driving transistor T1 to improve the performance of the driving transistor T1 and to maintain the voltage of the gate electrode. The second electrode of the driving transistor T1 may be electrically connected to the metal layer M1, and this is the structure connected to the voltage of the anode. However, according to the exemplary embodiment, the driving voltage ELVDD may be transferred to the metal layer.

The second transistor T2 (hereinafter referred to as the switching transistor) is a transistor that receives the data voltage into the pixel PX. The gate electrode is connected to the gate line SC, the first electrode is connected to the data line 171, and the second electrode (the output side electrode) is connected to the gate electrode of the driving transistor T1. When the second transistor T2 is turned on according to the scan signal transmitted through the gate line SC, the data voltage transmitted through the data line 171 is transferred to the gate electrode of the driving transistor T1 and stored in the storage capacitor Cst.

The third transistor T3 (hereinafter referred to as the initialization transistor or the sensing transistor) is used to initialize the second electrode of the driving transistor T1, one electrode of the storage capacitor Cst, and the anode of the organic light emitting diode OLED. The gate electrode of the third transistor T3 is connected to the previous gate line SS and the first electrode is connected to the initialization voltage line SL/INT. The second electrode of the third transistor T3 is electrically connected to the second electrode (the output side electrode) of the driving transistor T1, and as a result, is also connected to the anode of the organic light emitting diode OLED.

The detection signal line SL/INT acts to sense the voltage of the anode connected to the second electrode of the third transistor T3, or to transmit the initialization voltage according to the section. As a result, the third transistor T3 is referred to as a sensing transistor.

The operation of the third transistor T3 is described. The voltage of the anode when the organic light emitting diode OLED emits light (a light emission section) is applied on one electrode of the storage capacitor Cst. In this case, the data voltage is applied to the other electrode of the storage capacitor Cst. When the gate-on voltage is applied to the gate electrode of the third transistor T3, the detection signal line 173 also operates as an initialization voltage line such that the voltage of the anode is transmitted to a sensing unit (not shown) through the sensing line. Hereinafter, this is referred to as a detection section. Then, in the remaining section among the section in which the gate-on voltage is applied to the gate electrode of the third transistor T3, the detection signal line 173 applies the initialization voltage Vint to initialize the voltage of the anode. Hereinafter, this is referred to as an initialization section.

If the voltage sensed in the sensing section is different from the expected anode voltage when it is determined based on the applied data voltage, the data voltage may be modified and provided to the pixel PX. In other words, the state of the driving transistor T1 may be changed and this may be sensed, thereby the organic light emitting diode OLED may emit light normally by sensing the data voltage corresponding thereto.

The anode voltage of the organic light emitting diode OLED is stored through the two capacitors Cst and Coled and maintained for one frame.

According to other embodiments, a pixel other than the pixel PX shown in FIG. 8 may be used.

Figure 9:
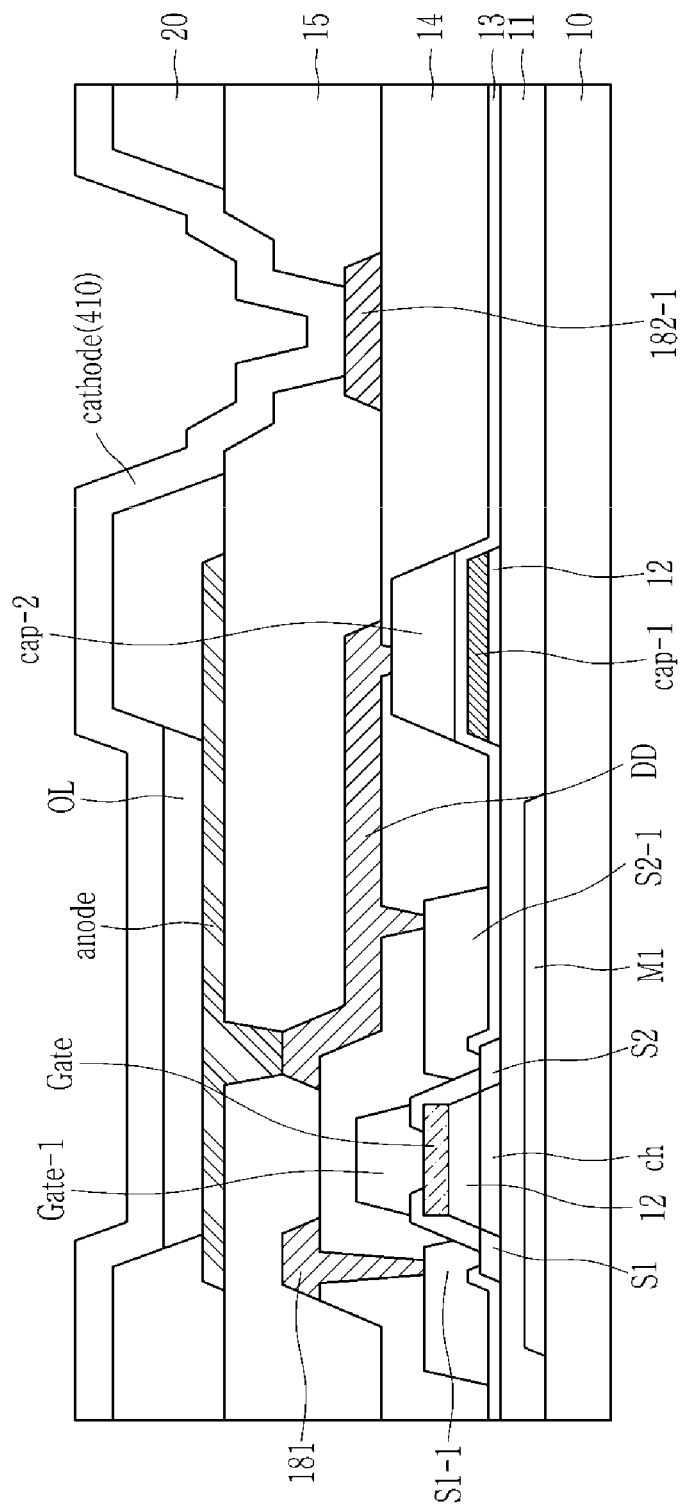
FIG. 9 and FIG. 10 are cross-sectional views of a pixel of an organic light emitting diode display according to an exemplary embodiment.
Figure 10:
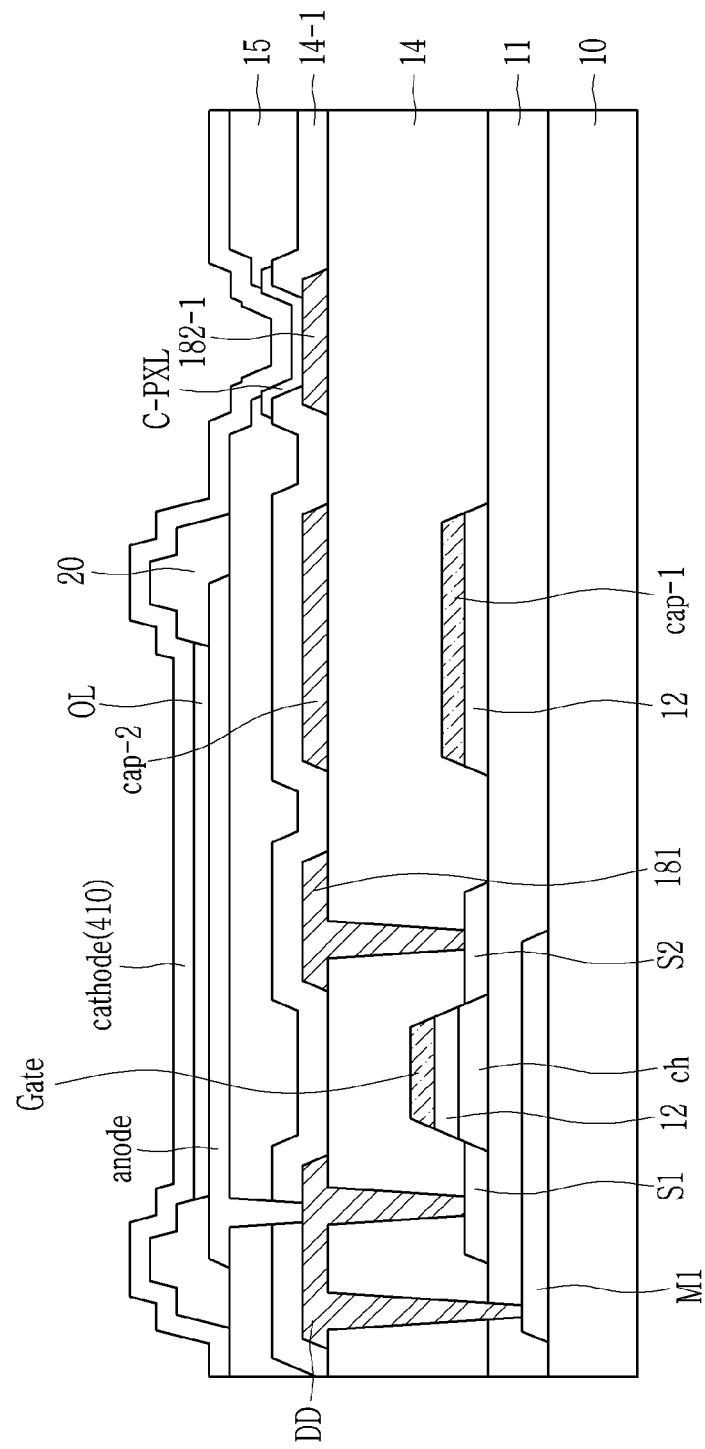

The pixel PX having the circuit structure like FIG. 8 may be formed while having the various layered structures like FIG. 9 and FIG. 10.

First, the structure of FIG. 9 is described.

FIG. 9 is a cross-sectional view of a pixel of an organic light emitting diode display according to an exemplary embodiment.

The cross-sectional view of FIG. 9 mainly shows the driving transistor T1, the storage capacitor Cst, and the organic light emitting diode OLED in FIG. 8.

The metal layer M1 is formed on the substrate 10, and the buffer layer 11 is stacked on the metal layer M1 and the substrate 10.

The semiconductor layer (S1, ch, and S2) is formed on the buffer layer 11. The semiconductor layer (S1, ch, and S2) includes a first region S1, a channel region ch, and a second region S2 of the driving transistor T1. The gate insulating layer 12 is formed on the semiconductor layer (S1, ch, and S2).

The gate conductive layer is formed on the gate insulating layer 12, and the gate electrode Gate and the first electrode cap-1 of the storage capacitor are shown in FIG. 9. The gate insulating layer 12 is disposed only under the gate electrode Gate and the first electrode cap-1 of the storage capacitor.

A second gate insulating layer 13 covering them is disposed thereon. The second gate conductive layer is disposed on the second gate insulating layer 13, and FIG. 9 shows connection electrodes S1-1, S2-1, and Gate-1 electrically connected to each electrode of the driving transistor T1 and the second electrode cap-2 of the storage capacitor. Among the connection electrode, the output side connection electrode S2-1 connected to the second electrode of the driving transistor T1 is also electrically connected to the metal layer M1. The storage capacitor is formed of the first electrode cap-1, the second electrode cap-2, and the second gate insulating layer 13 disposed therebetween.

The second gate conductive layer is covered by the interlayer insulating layer 14.

The data conductive layer is formed on the interlayer insulating layer 14, and in FIG. 9, the driving voltage line 181 transmitting the driving voltage ELVDD to the first electrode of the driving transistor T1, the output electrode DD of the driving transistor T1 connected to the output side connection electrode S2-1, and the peripheral driving low voltage connection portion 182-1 disposed in the peripheral area 120 are formed. The output electrode DD of the driving transistor T1 is also connected to the second electrode cap-2 of the storage capacitor.

The data conductive layer is covered by an organic insulator 15. The anode is formed on the organic insulator 15, and the anode is also connected to the output electrode DD of the driving transistor T1 to receive the output of the driving transistor T1.

The partition 20 is disposed on the anode, the partition 20 is opened, and the organic emission layer OL is disposed in the portion where the anode is exposed. The cathode 410 is disposed on the partition 20 of the organic emission layer OL.

The cathode 410 is connected to the peripheral low voltage connection portion 182-1 exposed by the opening disposed in the partition 20 and the organic insulator 15, and receives the driving low voltage ELVSS.

The exemplary embodiment of FIG. 9 has a metal layer, a semiconductor layer, a gate conductive layer, a second gate conductive layer, a data conductive layer, an anode layer, and a cathode layer. However, such a layered structure may vary for each exemplary embodiment, and another exemplary embodiment is shown in FIG. 10.

FIG. 10 is a cross-sectional view of a pixel of an organic light emitting diode display according to an exemplary embodiment.

The metal layer M1 is formed on the substrate 10, and the buffer layer 11 is stacked on the metal layer M1 and the substrate 10.

The semiconductor layer (S1, ch, and S2) is formed on the buffer layer 11. The semiconductor layer (S1, ch, and S2) includes the first region S1, the channel region ch, and the second region S2 of the driving transistor T1. The gate insulating layer 12 is formed on the semiconductor layer (S1, ch, and S2).

The gate conductive layer is formed on the gate insulating layer 12, and FIG. 10 shows the gate electrode Gate and the first electrode cap-1 of the storage capacitor. The gate insulating layer 12 is disposed only under the gate electrode Gate and the first electrode cap-1 of the storage capacitor.

The interlayer insulating layer 14 covering them is formed thereon.

The data conductive layer is formed on the interlayer insulating layer 14. In FIG. 10, the driving voltage line 181 transmitting the driving voltage ELVDD to the first electrode of the driving transistor T1, the output electrode DD of the driving transistor T1 connected to the output side connection electrode S2-1, the peripheral driving low voltage connection portion 182-1 disposed in the peripheral area 120, and the second electrode cap-2 of the storage capacitor are formed in the interlayer insulating layer 14. The output electrode DD of the driving transistor T1 is connected to the metal layer M1. Also, although not shown in FIG. 10, the output electrode DD of the driving transistor T1 is also electrically connected to the second electrode cap-2 of the storage capacitor.

The data conductive layer is covered by a second interlayer insulating layer 14-1 (also referred to as a passivation layer). The second interlayer insulating layer 14-1 has the opening exposing the peripheral driving low voltage connection portion 182-1, and an interlayer low voltage connection portion C-PXL electrically connected to the opened peripheral driving low voltage connection portion 182-1 is formed on the second interlayer insulating layer 14-1. A layer formed on the second interlayer insulating layer 14-1 is referred to as a second data conductive layer (also referred to as a pixel electrode layer according to an exemplary embodiment).

The organic insulator 15 covering the second data conductive layer is formed thereon. The anode is formed on the organic insulator 15, and the anode is connected to the output electrode DD of the driving transistor T1 to receive the output of the driving transistor T1.

The partition 20 is disposed on the anode, and on the organic emission layer OL in the portion where the partition 20 is opened and the anode is exposed. The cathode 410 is disposed on the partition 20 of the organic emission layer OL.

The cathode 410 is connected to the interlayer low voltage connection portion C-PXL exposed by the opening disposed in the partition 20 and the organic insulator 15, thereby receiving the driving low voltage ELVSS from the peripheral driving low voltage connection portion 182-1.

The exemplary embodiment of FIG. 10 has a metal layer, a semiconductor layer, a gate conductive layer, a data conductive layer, a second data conductive layer, an anode layer, and an cathode layer.

The exemplary embodiment of FIG. 9 and the exemplary embodiment of FIG. 10 are distinguished by the presence or absence of the second gate conductive layer and the presence or absence of the second data conductive layer.

Like FIG. 9 and FIG. 10, as the layered structure forming each pixel PX is varied, the structures of FIG. 2 to FIG. 7 may be composed of the different layers.

That is, in FIG. 2 to FIG. 7, the gate conductive layer is described as the layer where the peripheral data line 171-1 is formed, and the data conductive layer is described as the layer where the peripheral driving voltage line 181-1 and the peripheral driving low voltage connection portion 182-1 are formed. Also, the additional metal layers C1 and C2 are described as the metal layers disposed under the semiconductor layer. However, various combinations of the layer positions are possible. In addition, the gate conductive layer may be formed of two or more layers and the data conductive layer may be formed of two or more layers, so that a combination of various exemplary embodiments is possible. In addition, a pixel electrode layer disposed on the data conductive layer may also be used.

While this invention has been described in connection with what is presently considered to be practical exemplary embodiments, it is to be understood that the invention is not limited to the disclosed embodiments. On the contrary, it is intended to cover various modifications and equivalent arrangements included within the spirit and scope of the appended claims.

DESCRIPTION OF SYMBOLS

- 100: display panel
- 110: display area
- 120: peripheral area
- 200: flexible printed circuit substrate
- 250: driving chip
- 300: printed circuit board (PCB)
- 310: driving voltage application unit
- 320: driving low voltage application unit
- 10: substrate
- 11: buffer layer
- 12: gate insulating layer
- 13: second gate insulating layer
- 14: interlayer insulating layer
- 14-1: second interlayer insulating layer
- 15: organic insulator
- 20: partition
- 171: data line
- 2171: input wire
- 171-1: peripheral data line (first data line)
- 173, 173': detection signal line
- 173-1: peripheral detection signal line
- 181: driving voltage line
- 1181: driving voltage transmitting line
- 1182: driving low voltage transmitting line
- 2181: driving voltage output line
- 182: driving low voltage line
- 181-1: peripheral driving voltage line (first driving voltage line)
- 182-1: peripheral driving low voltage connection portion (first driving low voltage connection portion)
- 2182: driving low voltage output line
- 405, OC1, OC2: opening
- 410: cathode
- C1, C2: additional metal layer
- M1: metal layer
- OL: organic emission layer
- anode: anode
- SC: gate line
- SS: previous gate line
- C-PXL: interlayer low voltage connection portion

What is claimed is:

1. An organic light emitting diode display comprising:
    data wiring including a first data line and a second data line disposed in a peripheral area, wherein the first data line is longer than the second data line;
    a driving voltage wire including a driving voltage line and a first driving voltage line, the driving voltage line disposed in a display area, the first driving voltage line disposed in the peripheral area, and the first driving voltage line extending in a first direction;
    a driving low voltage wire including a cathode covering the display area and formed to the peripheral area and a first driving low voltage connection portion connected to the cathode and disposed in the peripheral area; and
    a first additional metal layer disposed in the peripheral area and overlapping the first driving low voltage connection portion,
    wherein a first portion of the first driving low voltage connection portion overlapping the first data line is smaller than a second portion of the first driving low voltage connection portion overlapping the second data line, and
    wherein the first additional metal layer is electrically connected to the first driving low voltage connection portion.

2. The organic light emitting diode display of claim 1, wherein
    the first driving low voltage connection portion includes a wiring portion that includes the first portion and the second portion and a pad portion disposed at each side of the wiring portion.

3. The organic light emitting diode display of claim 2, wherein
    the wiring portion of the first driving low voltage connection portion has a triangular shape.

4. The organic light emitting diode display of claim 2, wherein
    the first portion has a first thickness and the second portion has a second thickness.

5. The organic light emitting diode display of claim 1, wherein
    the first additional metal layer is disposed below a semiconductor layer.

6. The organic light emitting diode display of claim 1, wherein
    the first driving voltage line further includes a pad portion electrically connected to one side.

7. The organic light emitting diode display of claim 6, wherein
    the first driving voltage line and the driving voltage line are formed on the same layer.

8. An organic light emitting diode display comprising:
    data wiring including a first data line and a second data line disposed in a peripheral area, wherein the first data line is longer than the second data line;
    a driving voltage wire including a driving voltage line and a first driving voltage line, the driving voltage line disposed in a display area, the first driving voltage line disposed in the peripheral area, and the first driving voltage line extending in a first direction;
    a driving low voltage wire including a cathode covering the display area and formed to the peripheral area and a first driving low voltage connection portion connected to the cathode and disposed in the peripheral area; and a second additional metal layer disposed in the peripheral area and overlapping the first driving voltage line, and wherein a first portion of the first driving low voltage connection portion overlapping the first data line is smaller than a second portion of the first driving low voltage connection portion overlapping the second data line, and the second additional metal layer is electrically connected to the first driving voltage line.

9. The organic light emitting diode display of claim 8, wherein the second additional metal layer is disposed below a semiconductor layer.

10. The organic light emitting diode display of claim 8, wherein the first data line is formed in a gate conductive layer.

11. An organic light emitting diode display comprising:

a data wire including a data line disposed in a display area and a first data line disposed in a peripheral area;

a driving voltage wire including a driving voltage line disposed in the display area and a first driving voltage line disposed in the peripheral area and including a connection portion extending in a first direction; and a driving low voltage wire including a cathode disposed in the display area and a first driving low voltage connection portion connected to the cathode and disposed in the peripheral area, wherein the first driving voltage line or the first driving low voltage connection portion further includes an additional metal layer, and the additional metal layer is disposed in the peripheral area and has lower resistance than the first driving voltage line or the first driving low voltage connection portion.

12. The organic light emitting diode display of claim 11, wherein the additional metal layer is connected to the first driving low voltage connection portion, the additional metal layer connected to the first driving low voltage connection portion is a first additional metal layer, and the first additional metal layer includes a first portion and a second portion having a different width than the first portion.

13. The organic light emitting diode display of claim 12, wherein the first additional metal layer has a triangular shape.

14. The organic light emitting diode display of claim 12, wherein the first portion has a first thickness and the second portion has a second thickness.

15. The organic light emitting diode display of claim 12, wherein the first driving low voltage connection portion includes a pad portion disposed on both sides thereof.

16. The organic light emitting diode display of claim 15, wherein the connection portion of the first driving low voltage connection portion has a straight shape.

17. The organic light emitting diode display of claim 11, wherein the first driving voltage line has a pad portion extending in the first direction and electrically connected thereto.

18. The organic light emitting diode display of claim 11, wherein the first driving voltage line and the driving voltage line are formed on the same layer.

19. The organic light emitting diode display of claim 11, wherein the first data line is formed in a gate conductive layer.

* * * * *